(12) United States Patent
Cha et al.

(10) Patent No.: US 6,319,767 B1
(45) Date of Patent: Nov. 20, 2001

(54) METHOD TO ELIMINATE TOP METAL CORNER SHAPING DURING BOTTOM METAL PATTERNING FOR MIM CAPACITORS VIA PLASMA ASHING AND HARD MASKING TECHNIQUE

(75) Inventors: Randall Cher Liang Cha, Singapore (SG); Tae Jong Lee, Orlando, FL (US); Alex See, Singapore (SG); Lap Chan, San Francisco, CA (US); Yeow Kheng Lim, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/798,639

(22) Filed: Mar. 5, 2001

(51) Int. Cl.[7] .................. H01L 21/8242; H01L 21/4763
(52) U.S. Cl. ........................................... 438/250; 438/622
(58) Field of Search ................... 438/250, 253, 438/251, 393, 396, 387, 622, 632, 648, 638, 669, 690, 261, 3, 240

(56) References Cited

U.S. PATENT DOCUMENTS

| | | | |
|---|---|---|---|
| 5,162,258 | 11/1992 | Lemnios et al. | 437/184 |
| 5,466,617 | 11/1995 | Shannon | 437/40 |
| 5,812,364 | 9/1998 | Oku et al. | 361/312 |
| 5,998,264 | 12/1999 | Wu | 438/260 |
| 6,177,351 | * 1/2001 | Beratan et al. | 438/694 |

* cited by examiner

*Primary Examiner*—David Nelms
*Assistant Examiner*—Thao P. Le
(74) *Attorney, Agent, or Firm*—George O. Saile; Rosemary L. S. Pike

(57) ABSTRACT

A method for fabricating a metal-insulator-metal capacitor wherein top metal corner shaping during patterning is eliminated is described. An insulating layer is provided overlying a semiconductor substrate. A composite metal stack is formed comprising a first metal layer overlying the insulating layer, a capacitor dielectric layer overlying the first metal layer, a second metal layer overlying the capacitor dielectric layer, and a hard mask layer overlying the second metal layer. A first photoresist mask is formed overlying the hard mask layer. The composite metal stack is patterned using the first photoresist mask as an etching mask whereby the patterned first metal layer forms a bottom electrode of the capacitor. A portion of the first photoresist mask is removed by plasma ashing to form a second photoresist mask narrower than the first photoresist mask. The hard mask layer is patterned using the second photoresist mask as an etching mask. The second metal layer is patterned using the hard mask layer as an etching mask whereby the second metal layer forms a top electrode of the capacitor to complete fabrication of a metal-insulator-metal capacitor.

29 Claims, 3 Drawing Sheets

METHOD TO ELIMINATE TOP METAL CORNER SHAPING DURING BOTTOM METAL PATTERNING FOR MIM CAPACITORS VIA PLASMA ASHING AND HARD MASKING TECHNIQUE

BACKGROUND OF THE INVENTION (1) Field of the Invention

The present invention relates to a method of fabricating a metal-insulator-metal capacitor, and more particularly, to a method of forming a metal-insulator-metal capacitor without metal corner erosion in the fabrication of an integrated circuit device.

(2) Description of the Prior Art

Capacitor matching for metal-insulator-metal (MIM) capacitors in RF mixed signal applications is increasingly critical owing to stringent requirements. Nevertheless, process-instigated issues present major obstacles to efficient capacitor matching. One major process-instigated issue is varying capacitor characteristics owing to different extents of top metal erosion during bottom metal electrode patterning. The size of the landing area for a contact array, especially around the metal corners can differ between MIM capacitors. Because of relatively poor etch selectivity between photoresist and metal, and because of thinner resist thickness lining the top metal electrode, especially along the sidewalls and top edges, the corners of the top metal electrode will be aggressively etched. This results in jagged edges at the top metal or corner rounding of the top metal electrode. The degree of etching or rounding differs from capacitor to capacitor and is uncontrollable. This makes capacitor matching for MIM in mixed signal applications difficult. It is desired to find a method to eliminate top metal corner shaping and also to attain better etch process control.

Co-pending U.S. patent application Ser. No. 09/726,655 to Cha et al, filed on Nov. 30, 2000, teaches another method to eliminate top metal corner shaping by forming spacers on the top metal electrode. The spacers provide a sloping contour for the photoresist so that photoresist thinning at the corners is avoided. U.S. Pat. No. 5,812,364 to Oku et al, 5,998,264 to Wu, 5,466,617 to Shannon, and 5,162,258 to Lemnios et al show various MIM capacitor processes.

SUMMARY OF THE INVENTION

Accordingly, it is a primary object of the invention to provide an effective and very manufacturable process for producing a metal-insulator-metal capacitor.

Another object of the present invention is to provide a method for fabricating a metal-insulator-metal capacitor wherein top metal corner shaping during patterning is eliminated.

Yet another object of the present invention is to provide a method for fabricating a metal-insulator-metal capacitor wherein top metal corner shaping during patterning is eliminated by patterning the top metal electrode after patterning the bottom metal electrode, which is used for making interconnection.

A further object of the present invention is to provide a method for fabricating a metal-insulator-metal capacitor wherein top metal corner shaping during patterning is eliminated by using plasma ashing and hard masking techniques.

A still further object of the present invention is to provide a method for fabricating a metal-insulator-metal capacitor wherein top metal corner shaping during patterning is eliminated and wherein only one masking step is required for patterning first the bottom metal electrode and second, the top metal electrode.

In accordance with the objects of this invention, a method for fabricating a metal-insulator-metal capacitor wherein top metal corner shaping during patterning is eliminated is achieved. An insulating layer is provided overlying a semiconductor substrate. A composite metal stack is formed comprising a first metal layer overlying the insulating layer, a capacitor dielectric layer overlying the first metal layer, a second metal layer overlying the capacitor dielectric layer, and a hard mask layer overlying the second metal layer. A first photoresist mask is formed overlying the hard mask layer. The composite metal stack is patterned using the first photoresist mask as an etching mask whereby the patterned first metal layer forms a bottom electrode of the capacitor. A portion of the first photoresist mask is removed by plasma ashing to form a second photoresist mask narrower than the first photoresist mask. The hard mask layer is patterned using the second photoresist mask as an etching mask. The second metal layer is patterned using the hard mask layer as an etching mask whereby the second metal layer forms a top electrode of the capacitor to complete fabrication of a metal-insulator-metal capacitor.

BRIEF DESCRIPTION OF THE DRAWINGS

In the following drawings forming a material part of this description, there is shown.

DESCRIPTION OF THE PREFERRED EMBODIMENTS

Figure 1:
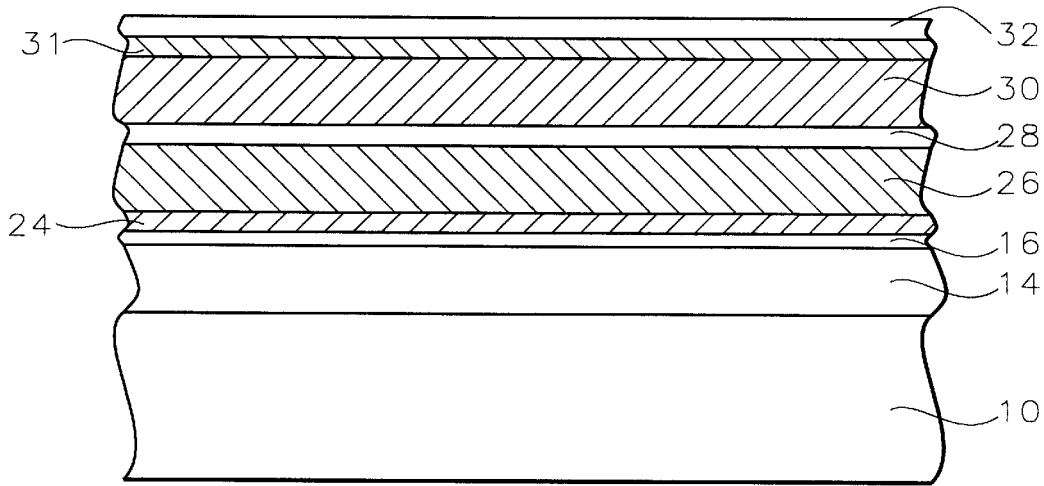
FIGS. 1 through 6 are schematic cross-sectional representations of a preferred embodiment of the present invention.

Referring now more particularly to FIG. 1, there is shown a partially completed integrated circuit device. The semiconductor substrate 10 is preferably composed of silicon having a (100) crystallographic orientation. Semiconductor device structures are formed in and on the semiconductor substrate. These may include gate electrodes and interconnection lines and associated source and drain regions. The semiconductor device structures, not shown, may be formed in layer 14 and covered with an insulating layer 16.

Connections are made to the underlying semiconductor device structures. For example, vias or contacts may be formed through the insulating layer 16 to contact devices within layer 14, not shown.

Now, the MIM capacitor of the present invention is to be formed. A barrier metal layer 24 is deposited over the insulating layer 16. This barrier metal layer may comprise silicon nitride, tantalum, tantalum nitride, tantalum and tantalum nitride, and so on, and have a thickness of between about 300 and 600 Angstroms. For example, the barrier layer may comprise a first layer of titanium nitride and a second layer of titanium, each layer having a thickness of 200 to 300 Angstroms. Now, a metal layer is formed over the barrier metal layer, such as by sputtering, electroplating, evaporation, physical vapor deposition, MBE, or spin-on metal (SOM). The metal layer 26 may comprise, for example, aluminum, aluminum-copper, copper, tungsten, alloys, and so on. The metal layer 26 has a thickness of between about 3500 and 4200 Angstroms. The metal layer 26 will form the bottom plate electrode of the capacitor.

A capacitor dielectric layer 28 is deposited over the metal layer 26 to a thickness of between about 100 and 200 Angstroms. The capacitor dielectric layer may comprise silicon nitride, oxide, nitrided oxide, oxynitride, ONO, or high dielectric constant materials such as Ta2O5 and titanium oxide.

A second metal layer 30 is deposited over the capacitor dielectric 28 to a thickness of between about 1500 and 2000 Angstroms. This metal layer also may comprise, for example, aluminum, aluminum-copper, copper, tungsten, alloys, and so on. A barrier metal layer 31 is deposited over the second metal layer 30. This barrier metal layer may comprise silicon nitride, tantalum, tantalum nitride, and so on and have a thickness of between about 300 and 600 Angstroms.

In a key step of the present invention, a hard mask layer 32 is formed over the top metal layer 30. The hard mask layer may comprise silicon oxide, nitride, ONO, nitrided oxides, oxynitrides, or organic or inorganic BARC materials, and so on. The thickness of the hard mask layer is between about 600 and 900 Angstroms.

Figure 2:
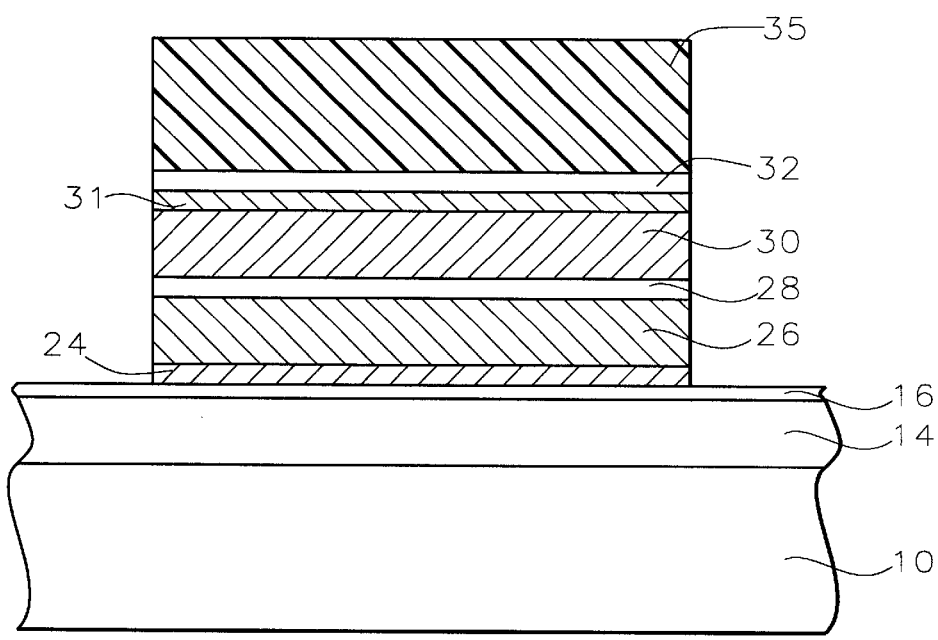

Referring now to FIG. 2, a photoresist mask 35 is formed overlying the hard mask layer. The composite stack, comprising the hard mask 32, barrier metal layer 31, top metal layer 30, capacitor dielectric 28, bottom metal layer 26, and barrier metal layer 24, is etched as shown in FIG. 2.

Figure 3:
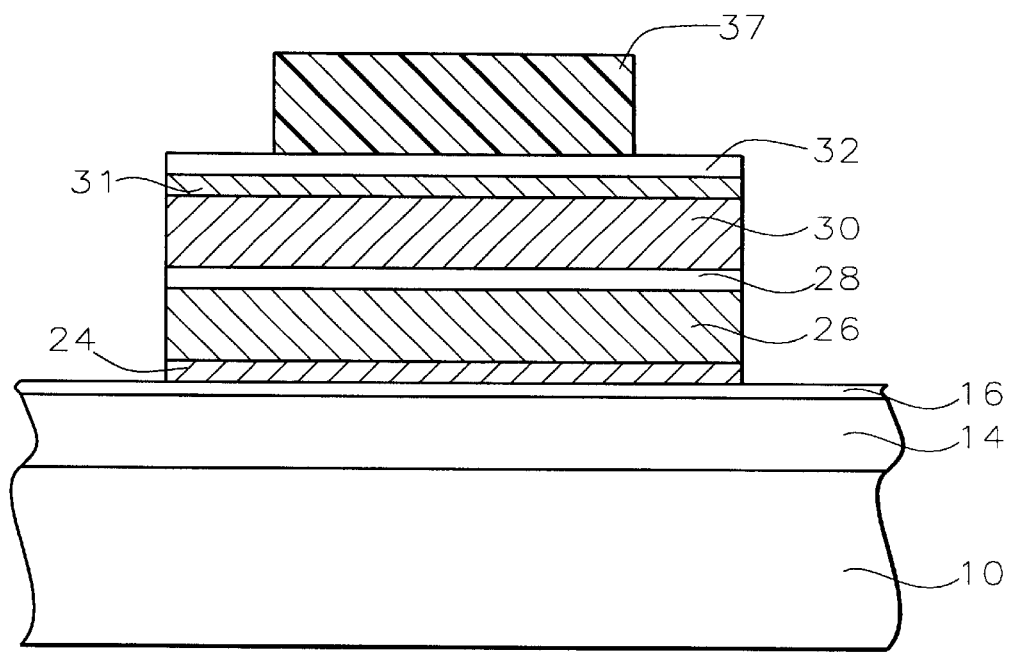

Now, in another key step of the present invention, the photoresist mask 35 is reduced in size by plasma ashing, as shown in FIG. 3. The reduced sized photoresist mask 37 provides a mask for patterning of the top metal electrode. In this way, only one lithography step is required to etch both the top and bottom metal electrodes.

The photoresist mask is reduced by oxygen plasma ashing. The ashing time is optimized to trim the mask at an extensively large scale because the remaining resist is used to etch the hard mask, not the top metal layer.

Figure 4:
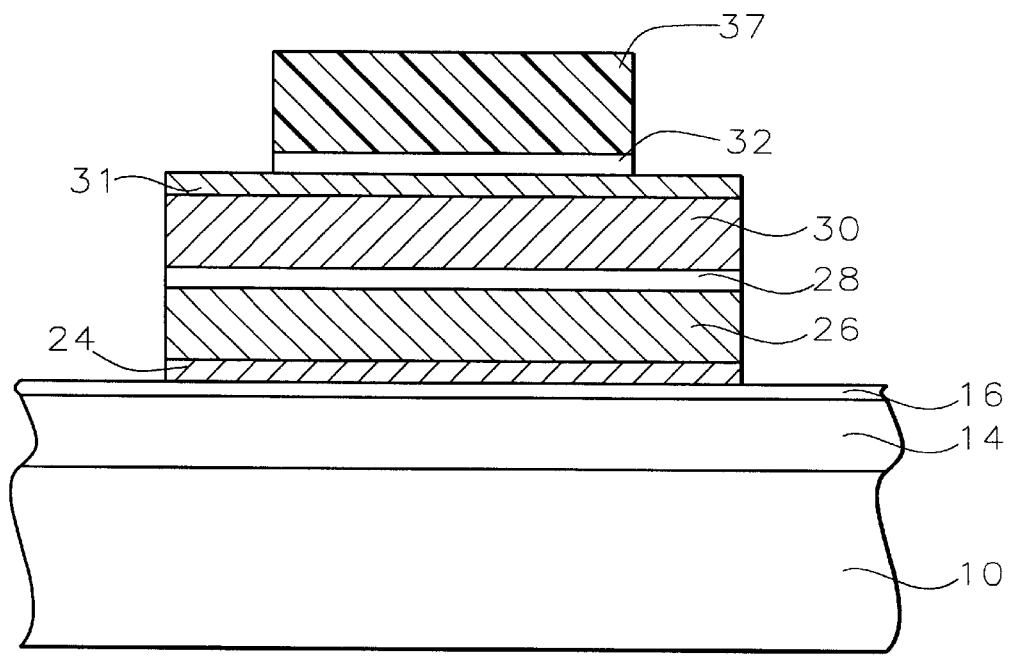

Referring now to FIG. 4, the photoresist mask 37 pattern is transferred to the hard mask layer 32 by etching. The remaining resist mask 37 may be too thin to etch the top metal layer 30, but it definitely is sufficient to etch the hard mask layer.

Figure 5:
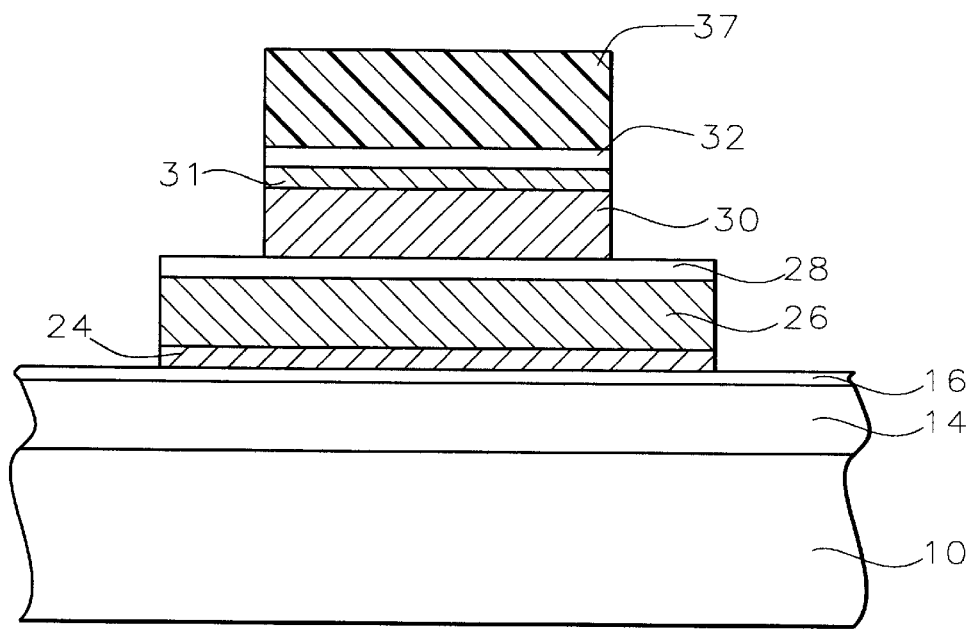

Now, the top metal layer 30 is patterned to form the top metal electrode, using the hard mask and the remaining photoresist mask 37 as the etching mask, as illustrated in FIG. 5. If there is any remaining photoresist mask 37, it is removed by a plasma stripping step. Alternatively, the photoresist mask 37 may be removed before the etching step. The hard mask 32 is sufficient to mask the top metal electrode during the etching step.

Figure 6:
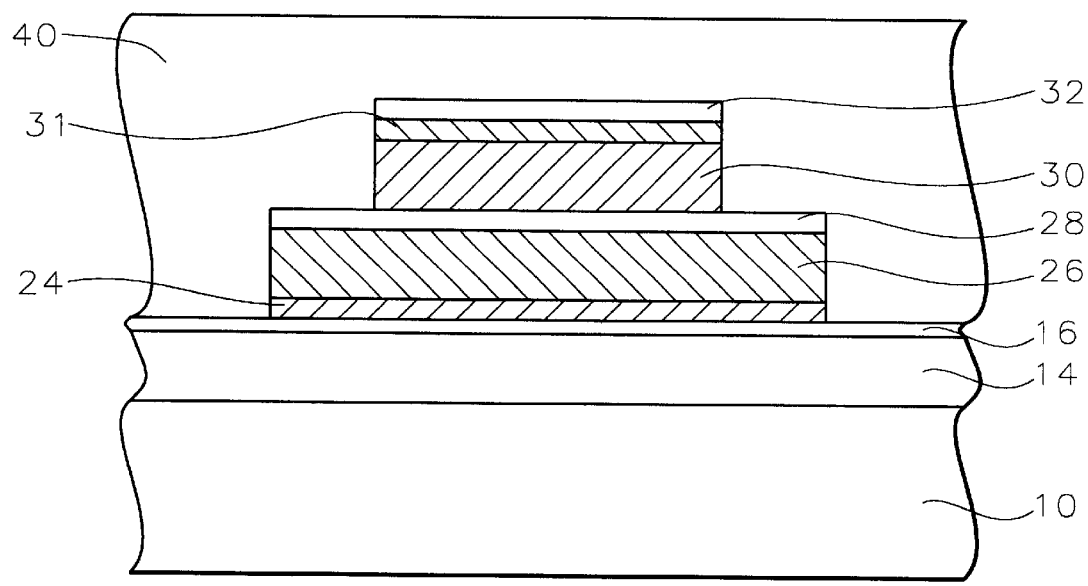

FIG. 6 illustrates the completed MIM capacitor comprising top plate electrode 30, capacitor dielectric 28, and bottom plate electrode 26. The hard mask layer may remain overlying the top plate electrode. An intermetal dielectric layer 40 is deposited over the capacitor. Processing continues as is conventional in the art to form interconnections, not shown.

FIGS. 1 through 6 illustrate the method of a preferred embodiment of the present invention. It should be understood that the MIM capacitor of the present invention may be formed at any level within the wafer.

The process of the invention results in the fabrication of a metal-insulator-metal capacitor having well-defined top and bottom electrodes without corner etching or rounding of the top metal electrode. The process of the present invention overcomes the issue of varying capacitor characteristics by preventing the top metal from being exposed and etched away during bottom metal etching. This improves capacitor matching capability which is especially important in RF mixed signal applications. The process of the present invention also employs plasma ashing and hard-masking techniques in order to save an additional masking step and to attain better process control.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a metal-insulator-metal capacitor comprising:

providing an insulating layer overlying a semiconductor substrate;

depositing a first metal layer over said insulating layer;

depositing a capacitor dielectric layer overlying said first metal layer;

depositing a second metal layer overlying said capacitor dielectric layer;

depositing a hard mask layer overlying said second metal layer;

forming a first photoresist mask overlying said hard mask layer;

patterning said hard mask layer, said second metal layer, said capacitor dielectric layer, and said first metal layer using said first photoresist mask as an etching mask to form a metal stack whereby patterned said first metal layer forms a bottom electrode of said capacitor;

reducing in size said first photoresist mask to form a second photoresist mask;

patterning said hard mask layer using said second photoresist mask as an etching mask;

removing said second photoresist mask; and patterning said second metal layer using said hard mask layer as an etching mask whereby said second metal layer forms a top electrode of said capacitor to complete fabrication of said metal-insulator-metal capacitor.

2. The method according to claim 1 wherein said semiconductor substrate includes semiconductor device structures such as gate electrodes and source and drain regions.

3. The method according to claim 1 wherein said semiconductor substrate includes semiconductor device structures such as gate electrodes and source and drain regions and multiple levels of metal interconnections.

4. The method according to claim 2 further comprising forming contacts between some of said semiconductor device structures and said first metal layer to form a node contact of said metal-insulator-metal capacitor.

5. The method according to claim 1 wherein said first metal layer comprises one of the group containing aluminum, aluminum-copper, copper, tungsten, and alloys.

6. The method according to claim 1 further comprising depositing a first barrier metal layer underlying said first metal layer wherein said first barrier metal layer has a thickness of between about 300 and 600 Angstroms.

7. The method according to claim 1 wherein said capacitor dielectric comprises one of the group containing: silicon nitride, tantalum, tantalum nitride, and tantalum/tantalum nitride.

8. The method according to claim 1 wherein said second metal layer comprises one of the group containing aluminum, aluminum-copper, copper, tungsten, and alloys.

9. The method according to claim 1 further comprising depositing a second barrier metal layer overlying said second metal layer wherein said second barrier metal layer has a thickness of between about 300 and 600 Angstroms.

10. The method according to claim 1 wherein said hard mask layer comprises one of the group containing oxides, nitrides, ONO, nitrided oxides, oxynitrides, and organic and inorganic BARC materials and having a thickness of between about 600 and 900 Angstroms.

11. The method according to claim 1 wherein said step of reducing in size said first photoresist mask comprises oxygen plasma ashing.

12. A method for fabricating a metal-insulator-metal capacitor comprising:
   providing an insulating layer overlying a semiconductor substrate;
   depositing a first metal layer over said insulating layer;
   depositing a capacitor dielectric layer overlying said first metal layer;
   depositing a second metal layer overlying said capacitor dielectric layer;
   depositing a hard mask layer overlying said second metal layer;
   forming a first photoresist mask overlying said hard mask layer;
   patterning said hard mask layer, said second metal layer, said capacitor dielectric layer, and said first metal layer using said first photoresist mask as an etching mask to form a metal stack whereby patterned said first metal layer forms a bottom electrode of said capacitor;
   ashing away a portion of said first photoresist mask to form a second photoresist mask narrower than said first photoresist mask;
   patterning said hard mask layer using said second photoresist mask as an etching mask;
   removing said second photoresist mask; and
   patterning said second metal layer using said hard mask layer as an etching mask whereby said second metal layer forms a top electrode of said capacitor to complete fabrication of said metal-insulator-metal capacitor.

13. The method according to claim 12 wherein said semiconductor substrate includes semiconductor device structures such as gate electrodes and source and drain regions.

14. The method according to claim 12 wherein said semiconductor substrate includes semiconductor device structures such as gate electrodes and source and drain regions and multiple levels of metal interconnections.

15. The method according to claim 13 further comprising forming contacts between some of said semiconductor device structures and said first metal layer to form a node contact of said metal-insulator-metal capacitor.

16. The method according to claim 12 wherein said first metal layer comprises one of the group containing aluminum, aluminum-copper, copper, tungsten, and alloys.

17. The method according to claim 12 further comprising depositing a first barrier metal layer underlying said first metal layer wherein said first barrier metal layer has a thickness of between about 300 and 600 Angstroms.

18. The method according to claim 12 wherein said capacitor dielectric comprises one of the group containing: silicon nitride, tantalum, tantalum nitride, and tantalum/tantalum nitride.

19. The method according to claim 12 wherein said second metal layer comprises one of the group containing aluminum, aluminum-copper, copper, tungsten, and alloys.

20. The method according to claim 12 further comprising depositing a second barrier metal layer overlying said second metal layer wherein said second barrier metal layer has a thickness of between about 300 and 600 Angstroms.

21. The method according to claim 12 wherein said hard mask layer comprises one of the group containing oxides, nitrides, ONO, nitrided oxides, oxynitrides, and organic and inorganic BARC materials and having a thickness of between about 600 and 900 Angstroms.

22. A method for fabricating a metal-insulator-metal capacitor comprising:
   providing an insulating layer overlying a semiconductor substrate;
   depositing a first barrier metal layer over said insulating layer;
   depositing a first metal layer over said barrier metal layer;
   depositing a capacitor dielectric layer overlying said first metal layer;
   depositing a second metal layer overlying said capacitor dielectric layer;
   depositing a second barrier metal layer overlying said second metal layer;
   depositing a hard mask layer overlying said second barrier metal layer;
   forming a first photoresist mask overlying said hard mask layer;
   patterning said hard mask layer, said second barrier metal layer, said second metal layer, said capacitor dielectric layer, said first metal layer, and said first barrier metal layer using said first photoresist mask as an etching mask to form a metal stack whereby patterned said first metal layer forms a bottom electrode of said capacitor;
   ashing away a portion of said first photoresist mask to form a second photoresist mask narrower than said first photoresist mask;
   patterning said hard mask layer using said second photoresist mask as an etching mask;
   removing said second photoresist mask; and
   patterning said second metal layer using said hard mask layer as an etching mask whereby said second metal layer forms a top electrode of said capacitor to complete fabrication of said metal-insulator-metal capacitor.

23. The method according to claim 22 wherein said semiconductor substrate includes semiconductor device structures such as gate electrodes and source and drain regions.

24. The method according to claim 22 wherein said semiconductor substrate includes semiconductor device structures such as gate electrodes and source and drain regions and multiple levels of metal interconnections.

25. The method according to claim 23 further comprising forming contacts between some of said semiconductor device structures and said first metal layer to form a node contact of said metal-insulator-metal capacitor.

26. The method according to claim 22 wherein said first metal layer comprises one of the group containing aluminum, aluminum-copper, copper, tungsten, and alloys.

27. The method according to claim 22 wherein said capacitor dielectric comprises one of the group containing: silicon nitride, tantalum, tantalum nitride, and tantalum/tantalum nitride.

28. The method according to claim 22 wherein said second metal layer comprises one of the group containing aluminum, aluminum-copper, copper, tungsten, and alloys.

29. The method according to claim 22 wherein said hard mask layer comprises one of the group containing oxides, nitrides, ONO, nitrided oxides, oxynitrides, and organic and inorganic BARC materials and having a thickness of between about 600 and 900 Angstroms.

* * * * *